United States Patent
Thoman, Jr. et al.

(10) Patent No.: US 12,557,231 B2
(45) Date of Patent: Feb. 17, 2026

(54) TWO-PIECE SEPARABLE WEDGE CLAMP FOR THERMAL MECHANICAL INTERFACE

(71) Applicant: BAE SYSTEMS Information and Electronic Systems Integration Inc., Nashua, NH (US)

(72) Inventors: Edward Thoman, Jr., Port Charlotte, FL (US); Richard A. Riley, Bloomingdale, NJ (US); Frank D. Phillips, Bedford, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 196 days.

(21) Appl. No.: 18/536,881

(22) Filed: Dec. 12, 2023

(65) Prior Publication Data

US 2025/0194037 A1    Jun. 12, 2025

(51) Int. Cl.
*H05K 7/14*    (2006.01)
*F16B 2/14*    (2006.01)

(52) U.S. Cl.
CPC ............ *H05K 7/1404* (2013.01); *F16B 2/14* (2013.01)

(58) Field of Classification Search
CPC ............................... H05K 7/1404; F16B 2/14
USPC ........................................................ 361/704
See application file for complete search history.

(56) References Cited

U.S. PATENT DOCUMENTS

| | | |
|---|---|---|
| 5,859,764 A | 1/1999 | Davis et al. |
| 8,233,279 B2 | 7/2012 | Sporer |
| 8,456,846 B2 * | 6/2013 | Mosier ............... H05K 7/20545 361/728 |
| 10,034,403 B1 | 7/2018 | Flannery et al. |
| 10,129,996 B2 * | 11/2018 | Rozzi ................... H05K 7/1424 |
| 2011/0261537 A1 * | 10/2011 | Sporer ............... H05K 7/20545 29/829 |
| 2016/0353597 A1 * | 12/2016 | Gilmore ............... H05K 7/1404 |
| 2017/0257966 A1 | 9/2017 | Rozzi et al. |

FOREIGN PATENT DOCUMENTS

WO    2020005175 A1    1/2020

OTHER PUBLICATIONS

Kattamis, Nicholas T. and Rozzi,Jay C., "An Advanced Card Lock for Space and Terrestrial Applications," American Institute of Aeronautics and Astronautics, (2016). 8 pages.
Rozzi,Jay C. and Kattamis, Nicholas T., "Creare's High-Performance Electronics Card Lock," Creare (2016). 1 page.

* cited by examiner

*Primary Examiner* — Zhengfu J Feng
(74) *Attorney, Agent, or Firm* — Gary McFaline

(57) ABSTRACT

A wedge clamp assembly includes a first wedge plate including a first planar surface, and a first sawtooth surface opposite the first planar surface. The first wedge plate is configured to be fixed with respect to an electronics module. The first sawtooth surface includes two or more inclined faces with respect to the first planar surface. The wedge clamp assembly further includes a second wedge plate including a second planar surface and a second sawtooth surface opposite the second planar surface. The second wedge plate is adjustable with respect to the first wedge plate. The second sawtooth surface includes two or more inclined faces with respect to the second planar surface. An angle of incline of the inclined faces of the first sawtooth surface is equal to or substantially equal to an angle of incline of the inclined faces of the second sawtooth surface.

18 Claims, 11 Drawing Sheets

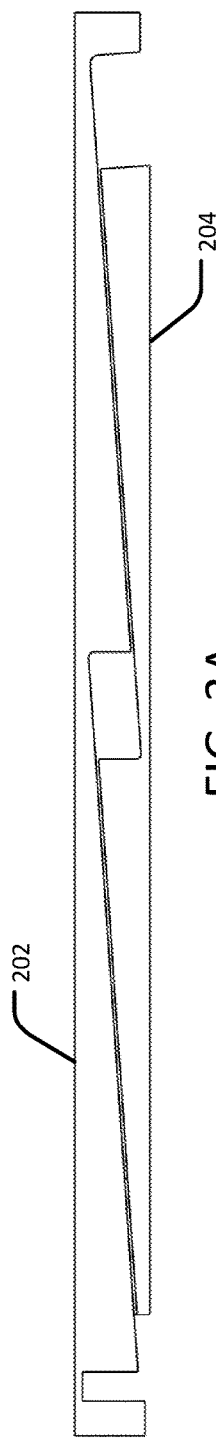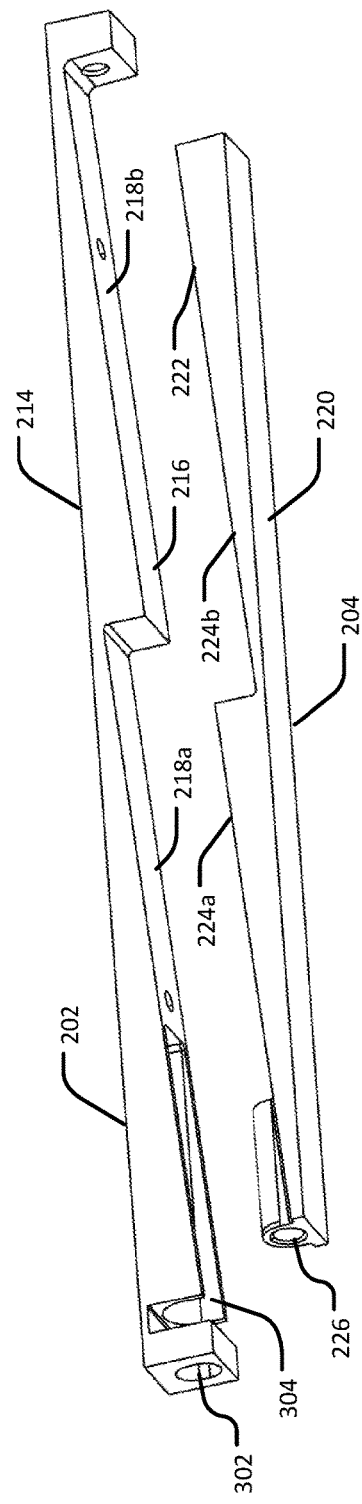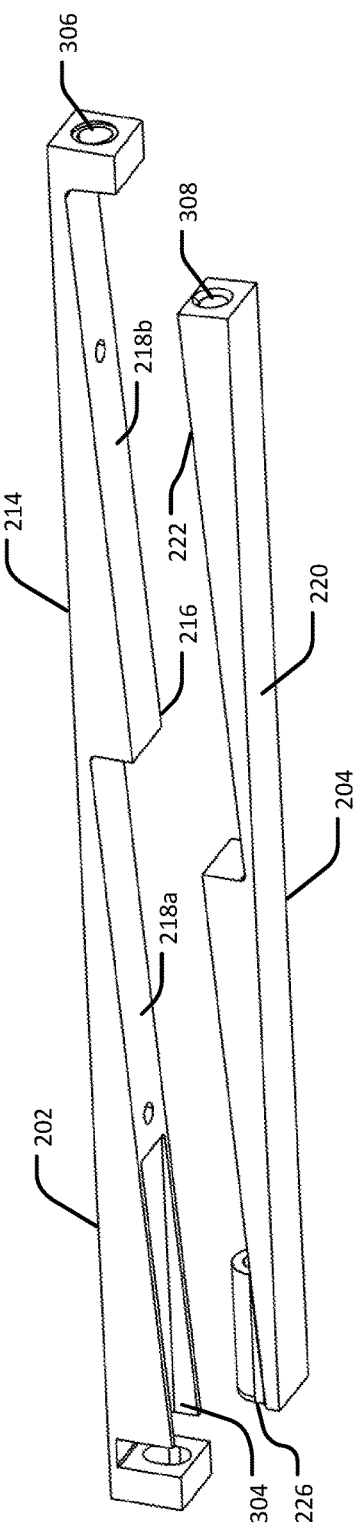

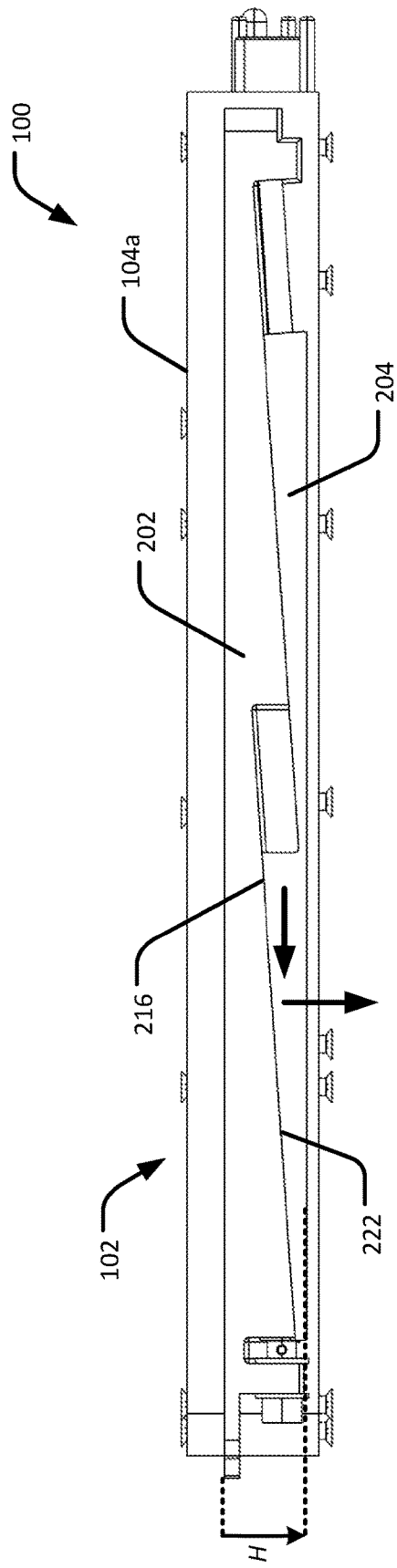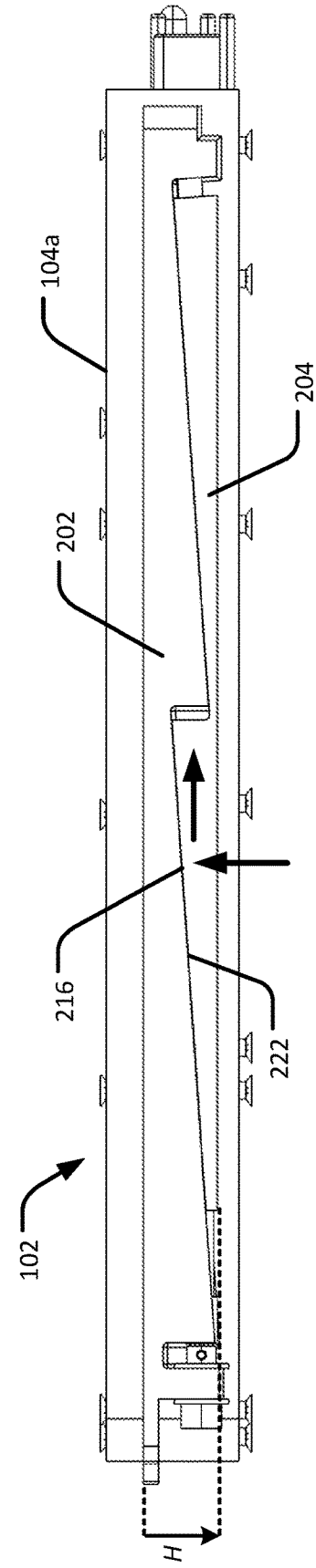

TWO-PIECE SEPARABLE WEDGE CLAMP FOR THERMAL MECHANICAL INTERFACE

FIELD OF DISCLOSURE

The present disclosure relates to mechanical interfaces, and more particularly, to a two-piece separable wedge clamp for a thermal mechanical interface.

BACKGROUND

A thermal mechanical interface is a device for securing an electronics module, such as a printed circuit board, to an electronics chassis and for providing a cooling path for transferring heat away from the electronics module. Typically, the chassis includes features for removing heat from the electronics module, such as fans, liquid cooling systems, and convective heat exchangers. However, as electronics become more powerful, they also produce more heat, which must be dissipated efficiently to prevent overheating of the electronics. Therefore, non-trivial issues remain with respect to heat management in electronics systems.

BRIEF DESCRIPTION OF THE DRAWINGS

FIGS. 3A, 3B, and 3C are side elevation and perspective views of a first wedge plate and a second wedge plate of the wedge clamp assembly of FIGS. 1A-B, in accordance with an example of the present disclosure.

FIGS. 10A and 10B show further side elevation assembled views of the electronics module of FIGS. 1A-B, in accordance with an example of the present disclosure.

Although the following detailed description will proceed with reference being made to illustrative embodiments, many alternatives, modifications, and variations thereof will be apparent in light of this disclosure.

DETAILED DESCRIPTION

A wedge clamp assembly is described. In an example, the wedge clamp assembly includes a first wedge plate including a first planar surface, and a first sawtooth surface opposite the first planar surface. The first wedge plate is configured to be fixed with respect to an electronics module. The first sawtooth surface includes two inclined faces with respect to the first planar surface. The wedge clamp assembly further includes a second wedge plate including a second planar surface and a second sawtooth surface opposite the second planar surface. The second wedge plate is adjustable with respect to the first wedge plate. The second sawtooth surface includes two inclined faces with respect to the second planar surface. An angle of incline of the two inclined faces of the first sawtooth surface is equal to or substantially equal to an angle of incline of the two inclined faces of the second sawtooth surface. As used herein, the term "substantially equal" is used to account for minor variations in manufacturing due to tolerances, errors, and other attributes that make exact manufacturing impossible. In some other embodiments, the first sawtooth surface includes three or more inclined faces with respect to the first planar surface, and the second sawtooth surface similarly includes three or more inclined faces with respect to the second planar surface. In any such cases, each inclined face of the first sawtooth surface can engage in a complementary fashion with a corresponding inclined face of the second sawtooth surface. Numerous other embodiments and variations will be apparent.

General Overview

An electronics module can be secured to an electronics chassis using a two-piece wedge clamp, as described herein. The two-piece wedge clamp provides thermal conductance between a core of the electronics module and the chassis, which acts as a heat sink or exhaust for transferring heat away from the electronics module. The two-piece wedge clamp removes heat from both sides of the wedge clamp, thus making the wedge clamp effective at reducing thermal temperatures of the module. Also, the two-piece wedge clamp provides high contact pressures, which can result in lower contact resistances (e.g., 50% greater contact pressure than some existing wedge clamp designs). The two-piece wedge clamp can, in some examples, be configured with larger contact surfaces, which can transfer more heat to the back side of the wedge clamp (e.g., 240%>area in contact on far side of wedge clamp). In some examples, the two-piece wedge clamp can be retrofitted onto existing modules.

Example Two-Piece Long Wedge Clamp Assembly

Figure 1A:
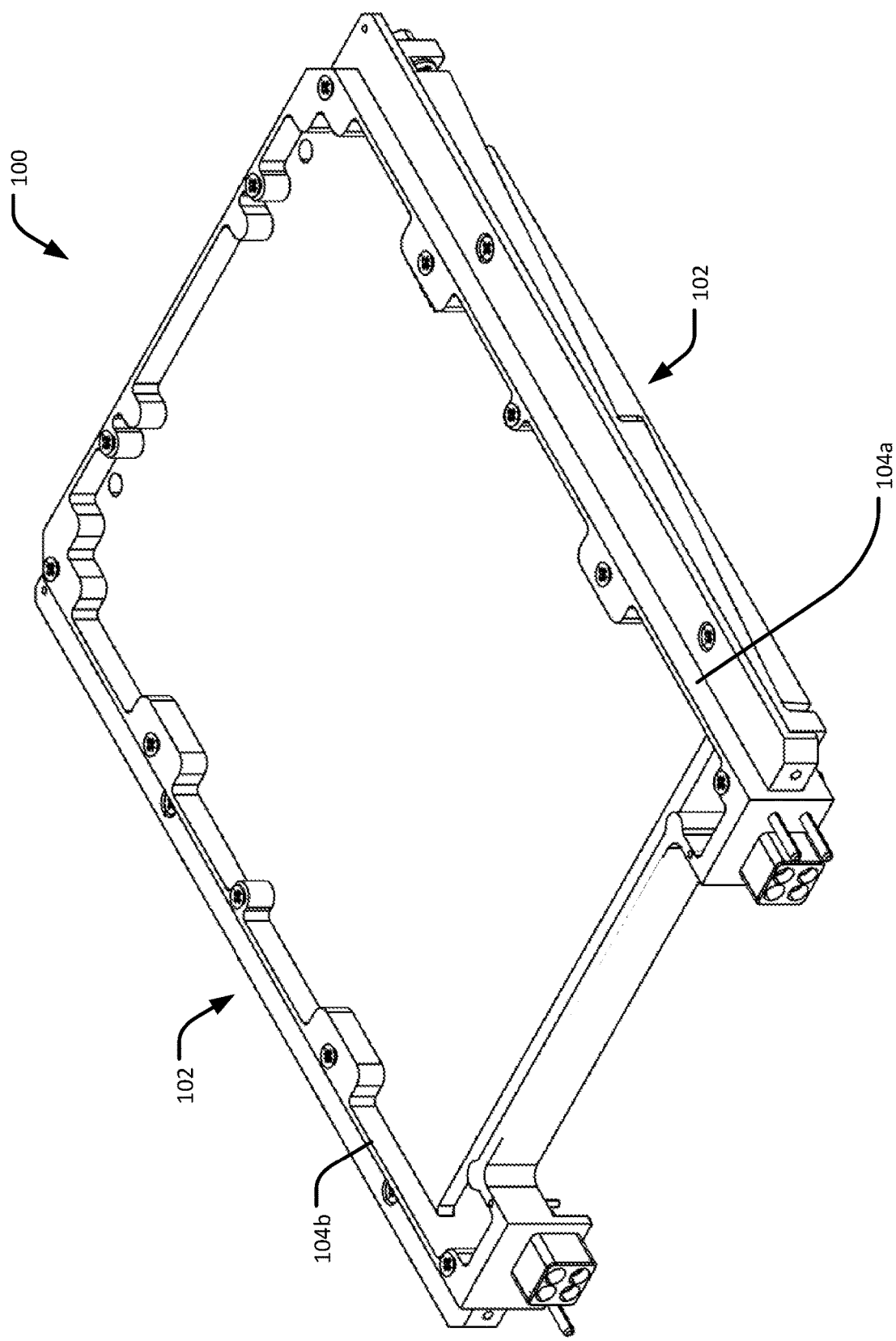
FIG. 1A is a first perspective view of an electronics module with a wedge clamp assembly, in accordance with an example of the present disclosure.
Figure 1B:
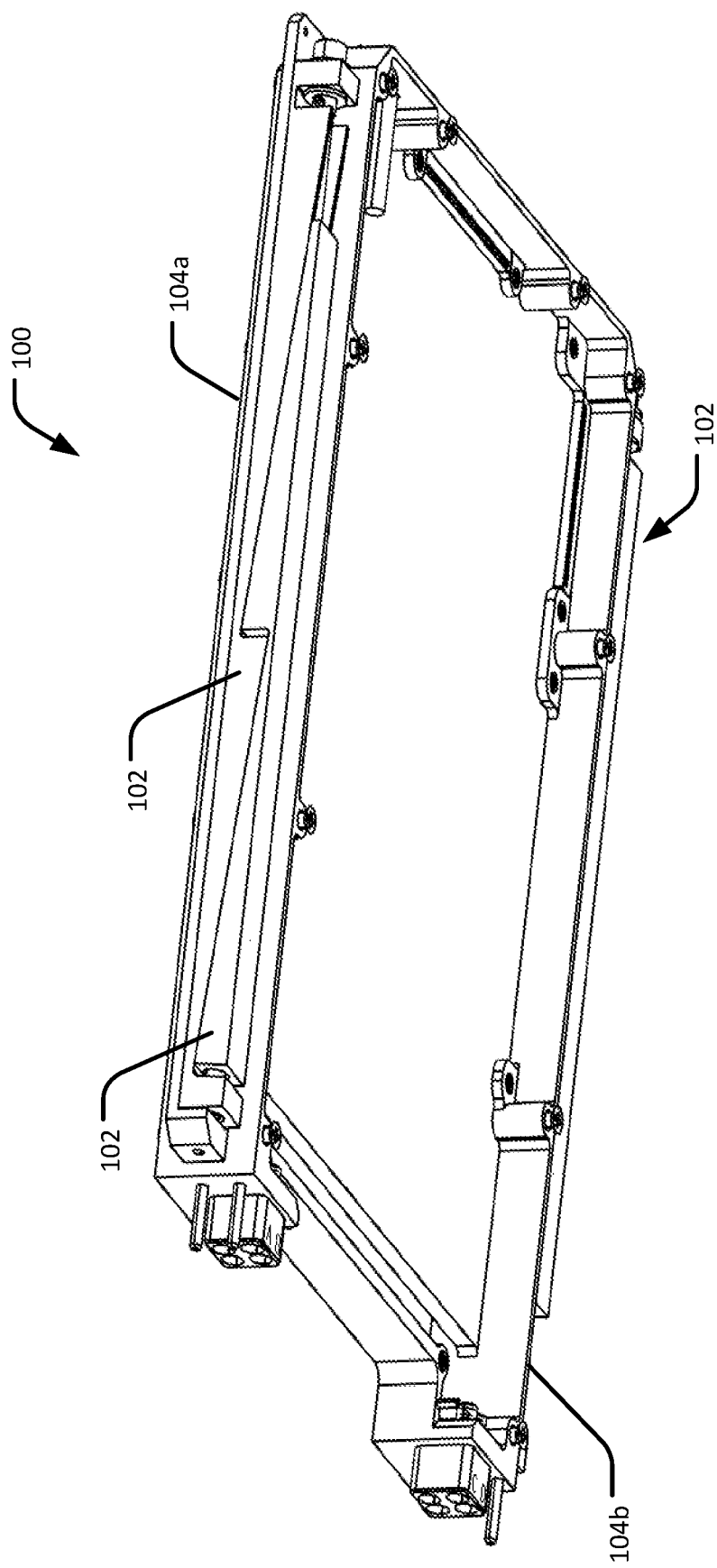
FIG. 1B is a second perspective view of the electronics module and the wedge clamp assembly, in accordance with an example of the present disclosure.

FIG. 1A is a first perspective view of an electronics module 100 with a wedge clamp assembly 102 on two opposite edges 104a, 104b of the electronics module 100, in accordance with an example of the present disclosure. FIG. 1B is a second perspective view of the electronics module 100 and the wedge clamp assembly 102, in accordance with an example of the present disclosure. The wedge clamp assembly 102 is configured to secure the electronics module 100 to an electronics chassis by expanding so as to apply pressure between the electronics module 100 and the electronics chassis (such as a card slot), as well as to provide thermal transfer from the electronics module 100 to the electronics chassis, such as described in further detail below.

In some examples, the electronics module 100 includes a printed circuit board or other heat-producing circuitry, which is installable into, and removable from, the electronics chassis as a modular component. While the example electronics module 100 shown in FIGS. 1A-B includes two wedge clamp assemblies 102, one on each edge 104a, 104b, respectively, it will be understood that more or fewer wedge clamp assemblies 102 can be used (e.g., one wedge clamp assembly 102 on one edge, one wedge clamp assembly 102 per edge, two wedge clamp assemblies 102 per edge, etc.).

The amount of heat transfer through the wedge clamp assembly 102 is a function of the contact surface area between the pieces of the wedge clamp, and the amount and uniformity of pressure applied by the wedge clamp against the chassis. Thus, it is appreciated that the structural design of the wedge clamp can have a significant impact on thermal management of the electronics module. In an example, as described in further detail below, the pieces of the wedge clamp have a sawtooth-like shape, which provides a balance between the horizontal translation of the wedge to the vertical movement of the wedge.

In some examples, at least a portion of the wedge clamp assembly 102 is integral with the electronics module 100; that is, at least a first portion of the wedge clamp assembly 102 is permanently affixed to a core, one or more rails, or other structures of the electronics module 100, while at least a second portion of the wedge clamp assembly 102 is movable with respect to the first portion so as to produce a wedge-like action between the first portion and the electronics chassis. Such an integral design eliminates a thermal resistance in the cooling path and provides the improved thermal benefits of the two-piece wedge clamp.

In some other examples, at least a portion of the wedge clamp assembly 102 is attached to the electronics module 100 using one or more fasteners (e.g., screws); that is, at least a first portion of the wedge clamp assembly 102 is removably affixed to a core, one or more rails, or other structures of the electronics module 100, while at least a second portion of the wedge clamp assembly 102 is movable with respect to the first portion so as to produce a wedge-like action between the first portion and the electronics chassis.

Figure 2A:
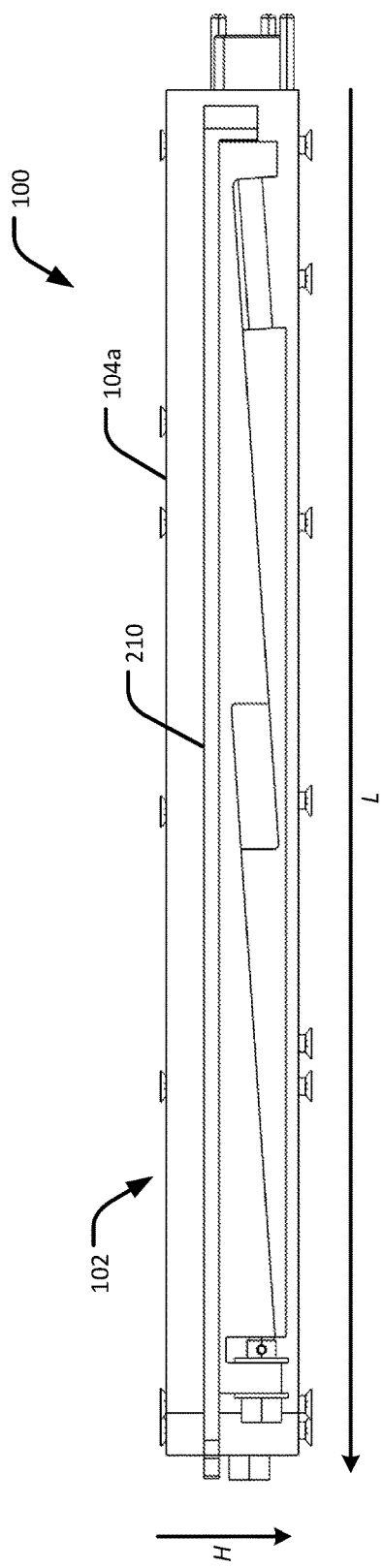
FIG. 2A is a side elevation assembled view of the electronics module of FIGS. 1A-B, in accordance with an example of the present disclosure.
Figure 2B:
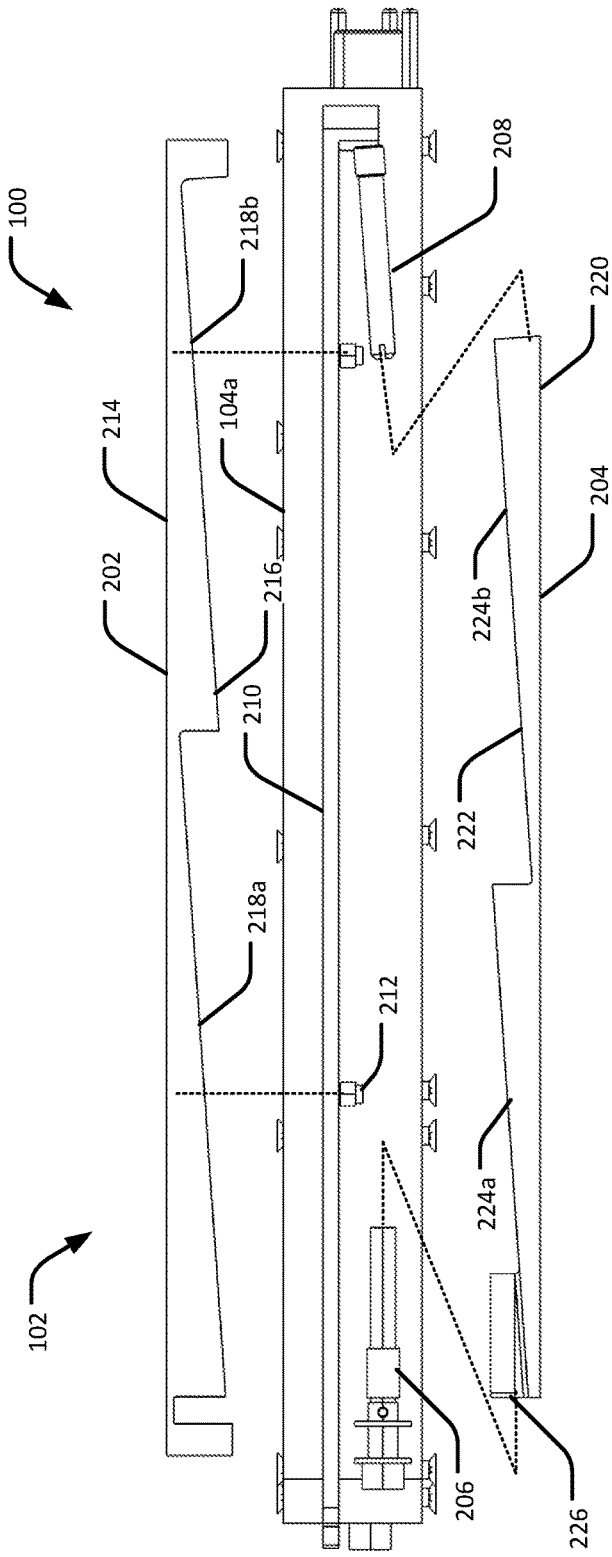
FIG. 2B is a side elevation exploded view of the electronics module of FIGS. 1A-B, in accordance with an example of the present disclosure.
Figure 2C:
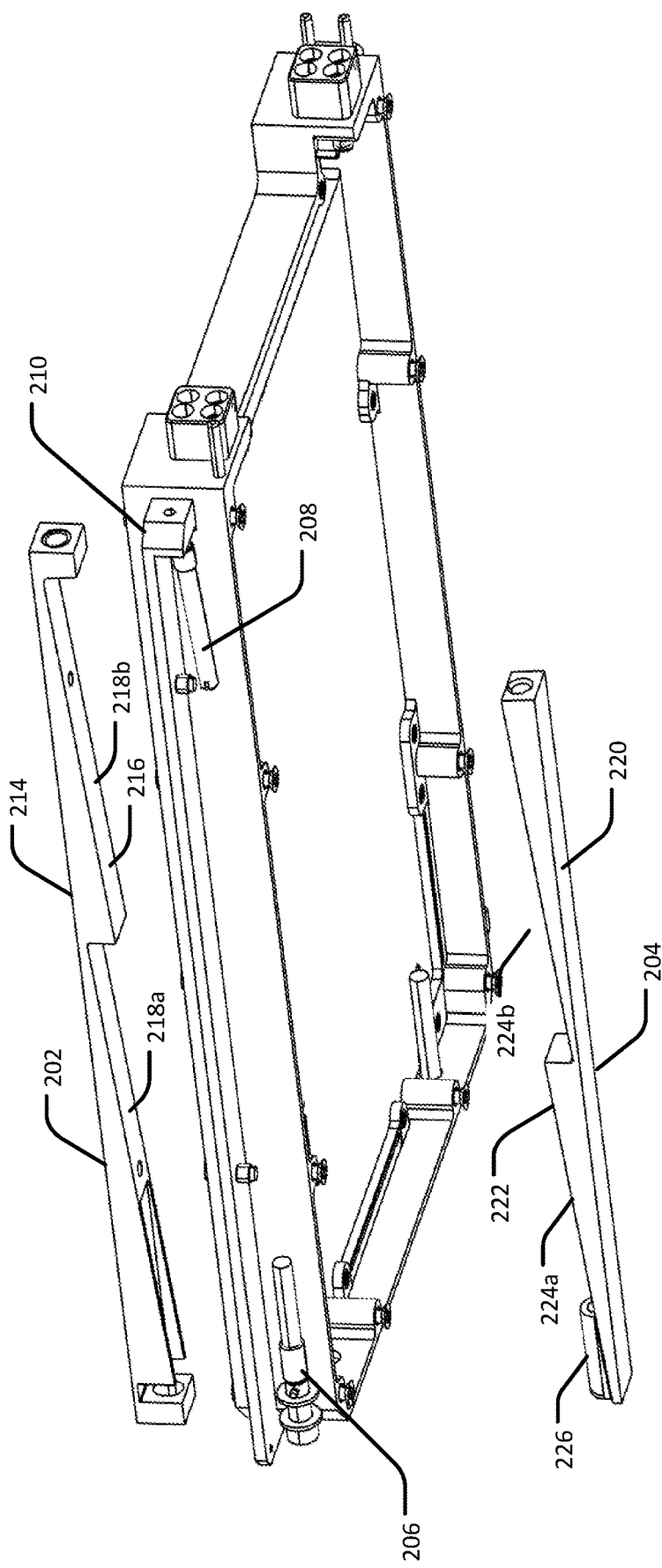
FIG. 2C is a perspective exploded view of the electronics module of FIGS. 1A-B, in accordance with an example of the present disclosure.

FIG. 2A is a side elevation assembled view of the electronics module 100 of FIGS. 1A-B, in accordance with an example of the present disclosure. FIG. 2B is a side elevation exploded view of the electronics module 100 of FIGS. 1A-B, in accordance with an example of the present disclosure. FIG. 2C is a perspective exploded view of the electronics module 100 of FIGS. 1A-B, in accordance with an example of the present disclosure. The wedge clamp assembly 102 includes a first wedge plate 202, a second wedge plate 204, an adjustable fastener 206, and an alignment pin 208. In some examples, such as shown in FIGS. 2A-B, the wedge clamp assembly 102 further includes a mounting flange 210, which is separate from the first wedge plate 202. The mounting flange 210 is configured to be coupled, fastened, or otherwise affixed to the first wedge plate 202 and to the electronics module 100. However, in some examples, the mounting flange 210 is integral with the first wedge plate 202 and/or the electronics module 100, such as shown and described with respect to FIG. 8.

Referring still to FIGS. 2A-B, the first wedge plate 202 is fixed with respect to the electronics module 100. For example, the first wedge plate 202 can be integral with, and immobilized with respect to, the mounting flange 210, a core, rail, or other structure of the electronics module 100. In another example, the first wedge plate 202 can be attached to the electronics module 100 and/or the mounting flange 210 using one or more mounting fasteners 212. The first wedge plate 202 includes a first planar surface 214 and a first sawtooth surface 216 opposite the first planar surface 214, such as indicated in FIG. 2B. The first planar surface 214 is planar along an entire length of the first wedge plate 202. The first sawtooth surface 216 includes two inclined faces 218a, 218b with respect to the first planar surface 214, providing a sawtooth-like profile.

The second wedge plate 204 is adjustable with respect to the electronics module 100 and the first wedge plate 202. For example, the second wedge plate 204 can interface with the adjustable fastener 206 and the alignment pin 208, which permit the second wedge plate 204 to slide longitudinally with respect to the first wedge plate 202. The adjustable fastener 206 can include, for example, a screw or draw-type latch. The second wedge plate 204 includes a second planar surface 220 and a second sawtooth surface 222 opposite the second planar surface 220, such as indicated in FIG. 2B. The second planar surface 220 is planar along an entire length of the second wedge plate 204. The second sawtooth surface 222 includes two inclined faces 224a, 224b with respect to the second planar surface 220, providing a sawtooth-like profile. An angle of incline of the two inclined faces 218a, 218b is equal to or substantially equal to an angle of incline of the two inclined faces 224a, 224b such that the two inclined faces 218a, 218b are substantially in contact with the two inclined faces 224a, 224b while the first sawtooth surface 216 is engaged with the second sawtooth surface 222.

While the two inclined faces 218a, 218b of the first wedge plate 202 are engaged with the two inclined faces 224a, 224b of the second wedge plate 204, such as shown in FIG. 2A, the wedge clamp assembly 102 expands laterally along dimension H (indicated in FIG. 2A) as the second wedge plate 204 slides longitudinally along dimension L with respect to the first wedge plate 202. The adjustable fastener 206 can, for example, included a threaded portion that engages with a corresponding threaded recess 226 on the second wedge plate 204 such that as the adjustable fastener 206 is rotated, the force of such rotation against the threaded recess 226 causes the second sawtooth surface 222 to slide longitudinally along the first sawtooth surface 216, while the alignment pin 208 interfaces with the second wedge plate 204 to maintain contact between the first sawtooth surface 216 and the second sawtooth surface 222 as the second wedge plate 204 slides with respect to the first wedge plate 202. The lateral expansion of the wedge clamp assembly 102 applies pressure in a wedge-like action between the first planar surface 214 and the electronics module 100, and pressure between the second planar surface 220 and the electronics chassis. The wedge clamp assembly 102 provides high contact pressures between the electronics module 100 and the electronics chassis (e.g., up to 50% greater pressures than some existing wedge lock designs). Such contact pressures facilitate thermal transfer from the electronics module 100 to the electronic chassis.

In an example, the first wedge plate 202 and the second wedge plate 204 each include a solid, thermally conductive material to provide structural rigidity and uniform pressure. The application of uniform pressure between the first wedge plate 202 and the second wedge plate 204 increases thermal conductivity between the electronics module 100 and the electronics chassis via the wedge clamp assembly 102. Furthermore, the sawtooth-like profile enables greater surface area (e.g., up to 60% of the total surface area of the first sawtooth surface 216 and the second sawtooth surface 222) to remain in contact between the first wedge plate 202 and the second wedge plate 204 as a function of the height of the wedge clamp assembly 102 along dimension H and length along dimension L as compared to existing wedge locks having a similar height and length that have only a single inclined surface (not sawtooth) on each wedge piece. The sawtooth-like profile of the wedge clamp assembly 102 thus facilitates improved thermal transfer efficiency for existing electronics modules 100 mounted in existing electronics chassis without the need to modify the dimensions of existing hardware to accommodate existing (non-sawtooth) wedge lock designs that are scaled up to provide larger thermal transfer surface areas. In some examples, the wedge clamp assembly 102 reduces printed circuit board and junction temperatures by up to approximately 4 to 5.3° Celsius (with an electronics module dissipating 69 watts and a 58° Celsius chassis rail temperature) and up to approximately 10° Celsius (with an electronics module dissipating 140 watts) on average as compared to temperatures with some existing wedge lock designs. In some examples, two or more wedge clamp assemblies 102 can be used side-by-side to accommodate wide electronics modules in the H dimension.

FIGS. 10A and 10B show side elevation assembled views of the electronics module 100 of FIGS. 1A-B, in accordance with an example of the present disclosure. In FIG. 10A, as the second wedge plate 204 moves laterally to the left (as indicated by the arrow) with respect to the first wedge plate 202, the second wedge plate 204 also moves downward (as indicated by the arrow) with respect to the first wedge plate 202 as the first sawtooth surface 216 slides along the second sawtooth surface 222, thereby increasing the height H of the wedge clamp assembly 102. In FIG. 10B, as the second wedge plate 204 moves laterally to the right (as indicated by the arrow) with respect to the first wedge plate 202, the second wedge plate 204 also moves upward (as indicated by the arrow) with respect to the first wedge plate 202 as the first sawtooth surface 216 slides along the second sawtooth surface 222, thereby decreasing the height H of the wedge clamp assembly 102.

Figure 6:
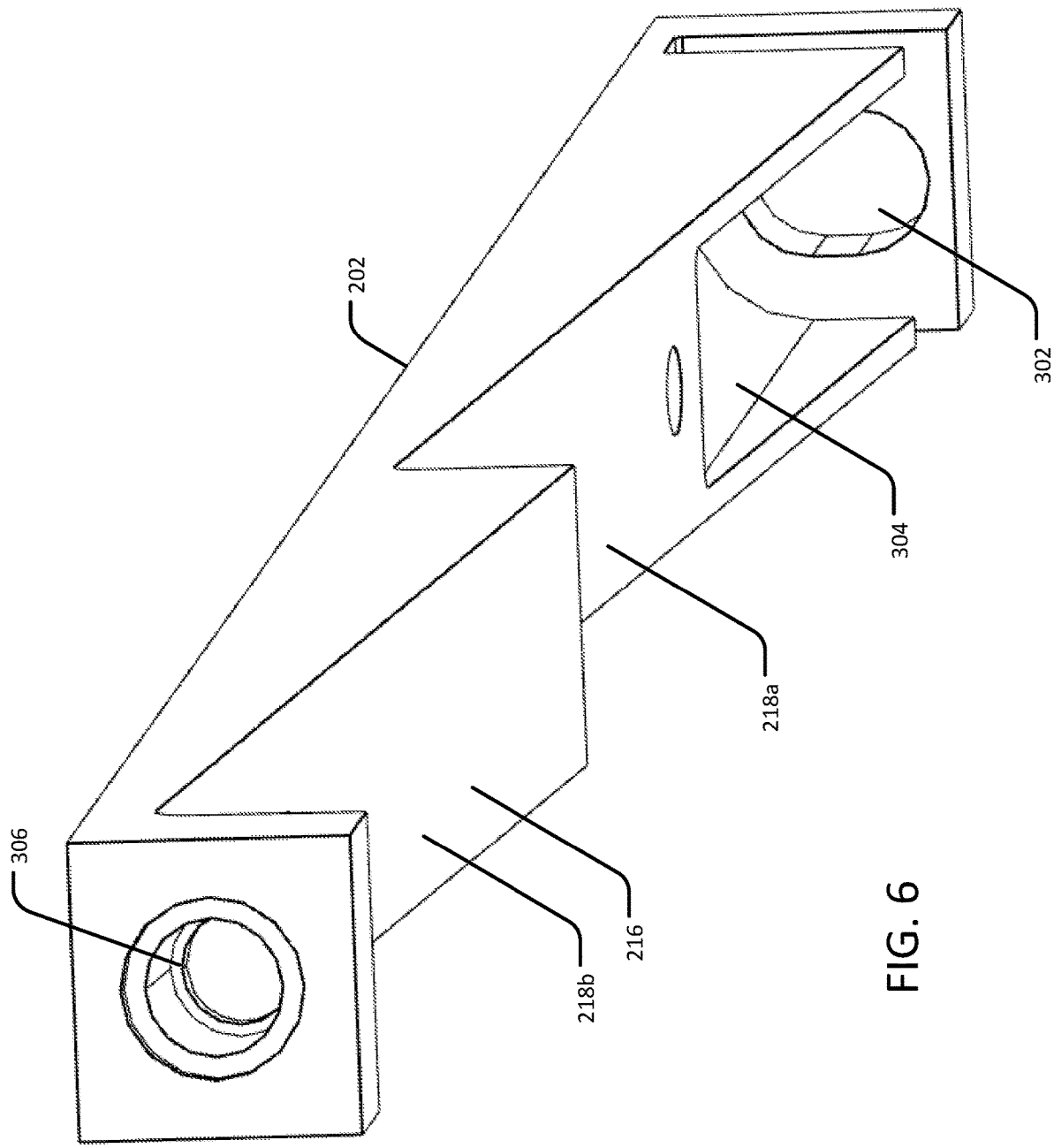
FIG. 6 is a perspective view of a distal end of the first wedge plate of FIGS. 3A-C, in accordance with an example of the present disclosure.
Figure 7:
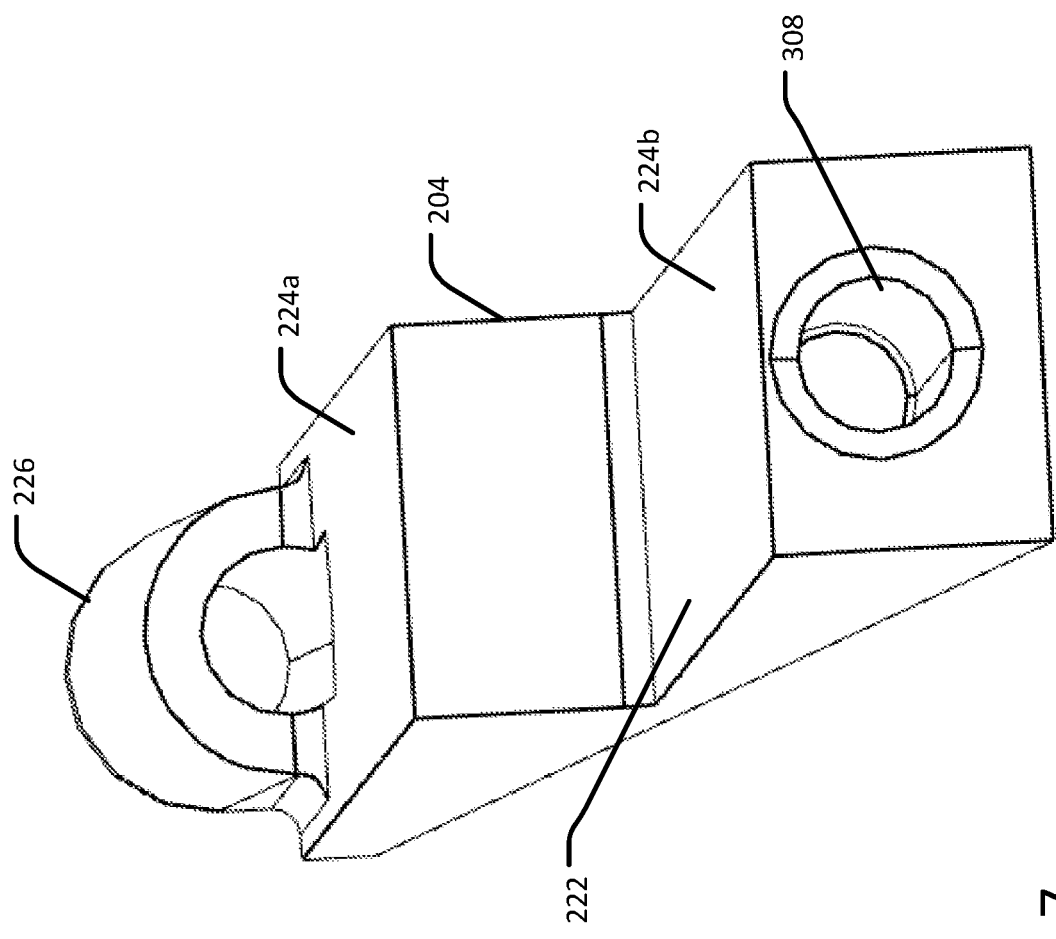
FIG. 7 is a perspective view of a distal end of the second wedge plate of FIGS. 3A-C, in accordance with an example of the present disclosure.

FIGS. 3A, 3B, and 3C are side elevation and perspective views of the first wedge plate 202 and the second wedge plate 204, in accordance with an example of the present disclosure. FIG. 6 is a perspective view of a distal end of the first wedge plate 202, in accordance with an example of the present disclosure. FIG. 7 is a perspective view of a distal end of the second wedge plate 204, in accordance with an example of the present disclosure. The first wedge plate 202 includes, at a proximal end, a first opening 302 configured to receive the adjustable fastener 206, and a slot 304 configured to receive the threaded recess 226 of the second wedge plate 204 therein. The first wedge plate 202 further includes, at the distal end, a second opening 306 configured to receive the alignment pin 208. The alignment pin 208 is stationary in the first wedge plate 202. The second wedge plate 204 includes, at the distal end, a third opening 308 configured to receive the alignment pin 208.

Figure 4:
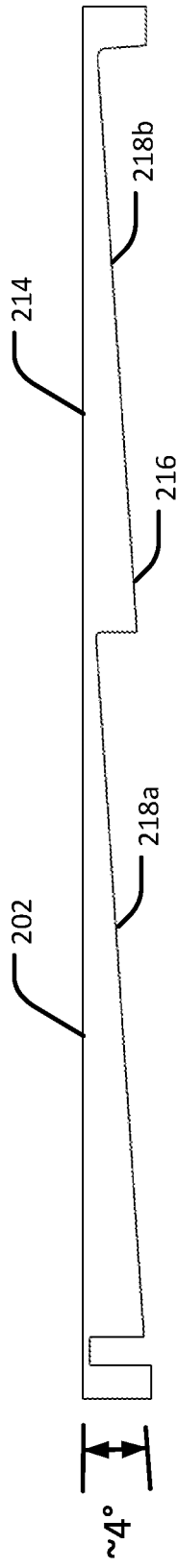
FIG. 4 is a side elevation view of the first wedge plate of FIGS. 3A-C, in accordance with an example of the present disclosure.

FIG. 4 is a side elevation view of the first wedge plate 202, in accordance with an example of the present disclosure. In this example, an angle of each of the two inclined faces 218a, 218b of the first sawtooth surface 216 with respect to the first planar surface 214 is approximately four degrees.

Figure 5:
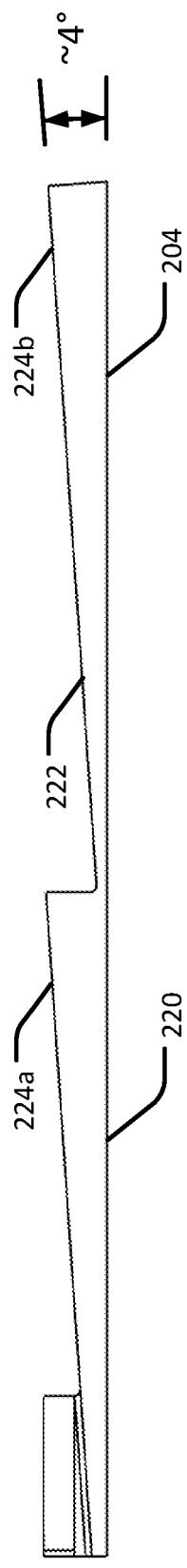
FIG. 5 is a side elevation view of the second wedge plate of FIGS. 3A-C, in accordance with an example of the present disclosure.

FIG. 5 is a side elevation view of the second wedge plate 204, in accordance with an example of the present disclosure. In this example, an angle of each of the two inclined faces 224a, 224b of the first sawtooth surface 216 with respect to the second planar surface 220 is approximately four degrees. In this manner, the angles of each of the two inclined faces 218a, 218b of the first sawtooth surface 216 are the same or approximately the same as the angles of each of the two inclined faces 224a, 224b of the second sawtooth surface 222 such that the two inclined faces 218a, 218b are substantially in contact with the two inclined faces 224a, 224b while the first sawtooth surface 216 is engaged with the second sawtooth surface 222.

Figure 8:
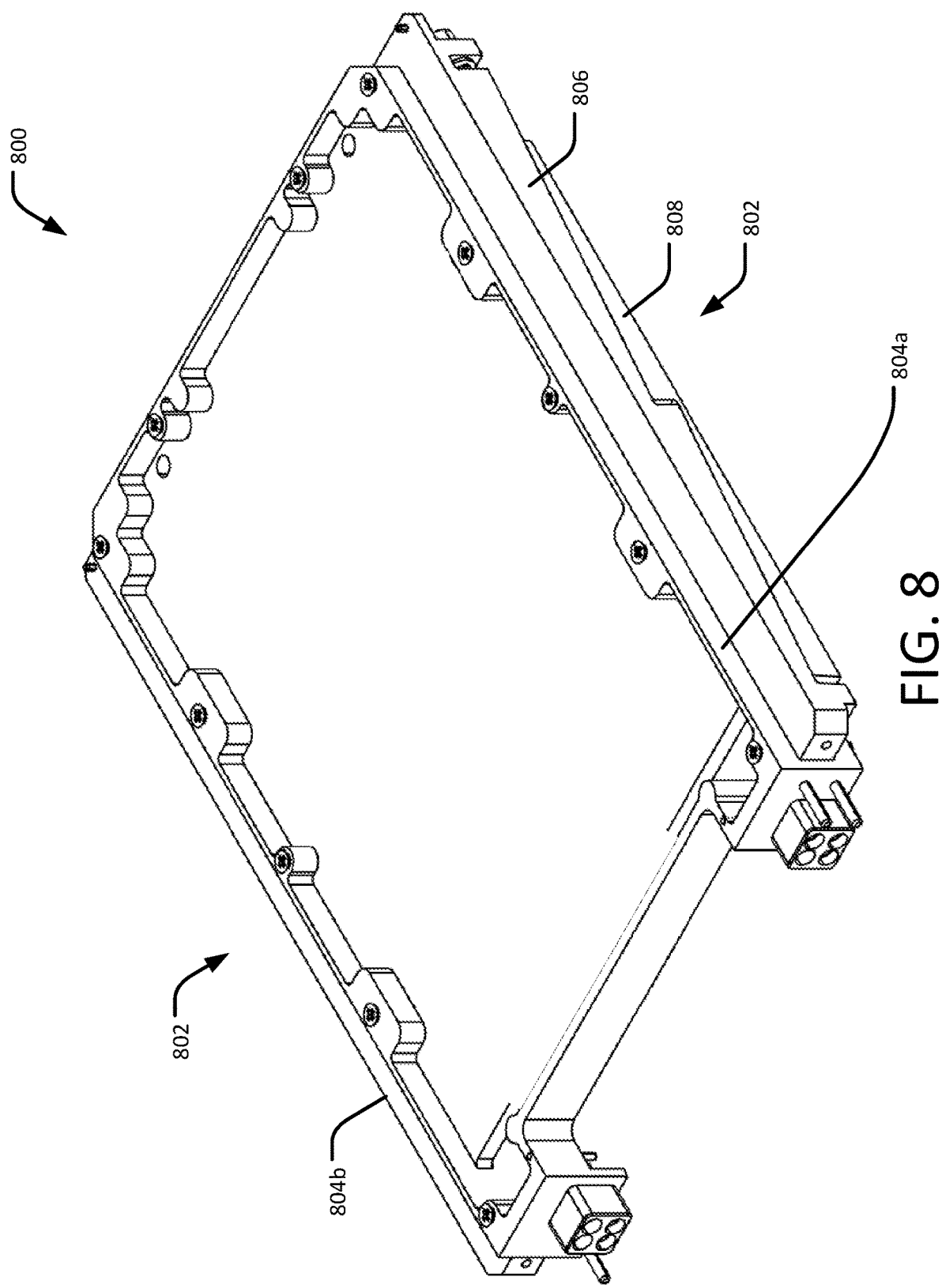
FIG. 8 is a perspective view of an electronics module with an integrated wedge clamp assembly, in accordance with an example of the present disclosure.

FIG. 8 is a perspective view of an electronics module 800 with a wedge clamp assembly 802 on two opposite edges 804a, 804b of the electronics module 800, in accordance with an example of the present disclosure. In this example, a first wedge plate 806 is integral with the edge 804a of the electronics module 800, and a second wedge plate 808 is adjustable with respect to the electronics module 800 and the first wedge plate 806. Thus, instead of having a separate mounting flange (such as the mounting flange 210 of FIG. 2B), in some examples the first wedge plate 806 is permanently affixed to the edge 804a of the electronics module 800.

Figure 9:
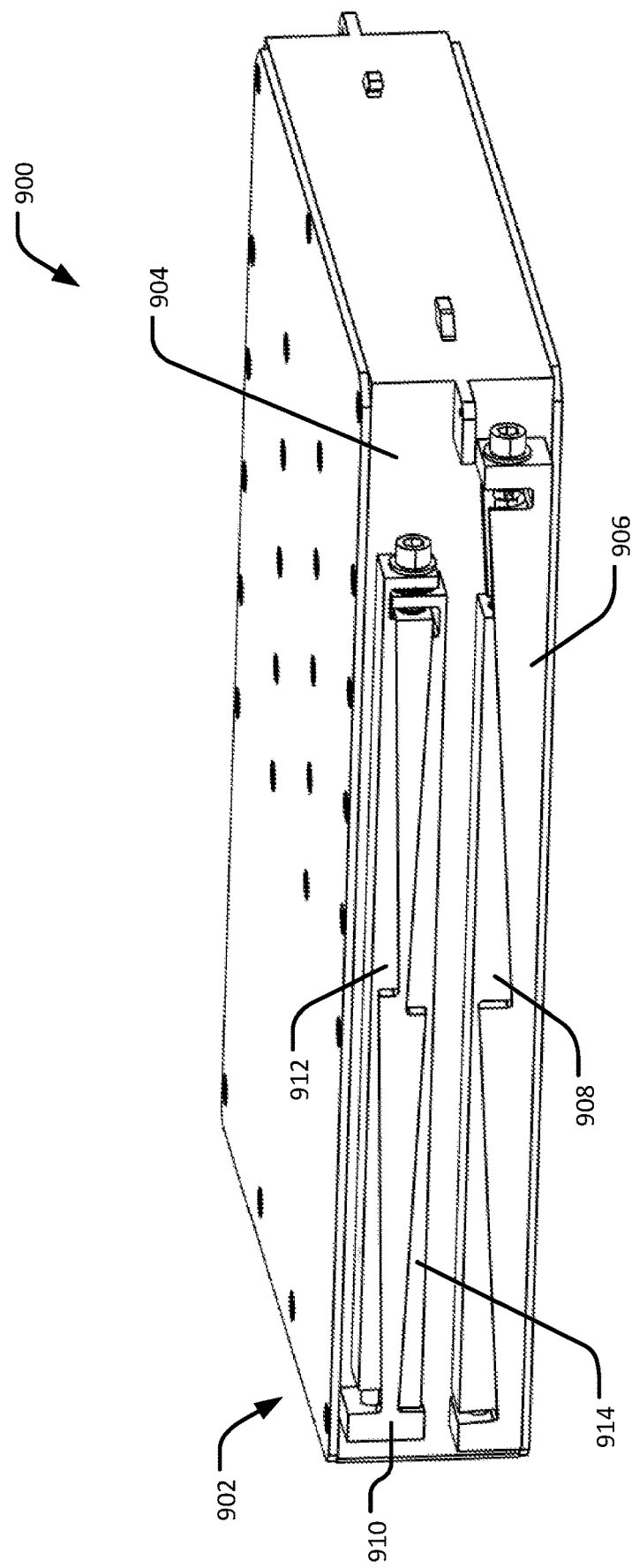
FIG. 9 is a perspective view of an electronics module with a double wedge clamp assembly, in accordance with an example of the present disclosure.

FIG. 9 is a perspective view of an electronics module 900 with a double wedge clamp assembly 902 on an edge 904 of the electronics module 900, in accordance with an example of the present disclosure. In this example, a first wedge plate 906 is integral with the edge 904 of the electronics module 900, and a second wedge plate 908 is adjustable with respect to the electronics module 900 and the first wedge plate 906, similar to the wedge clamp assembly 102 of FIGS. 1A-B. The double wedge clamp assembly 902 includes a third wedge plate 910 is integral with the edge 904 of the electronics module. A fourth wedge plate 912 and a fifth wedge plate 914 are adjustable with respect to the electronics module 900 and the third wedge plate 906. Adjustment of the double wedge clamp assembly 902 causes the fourth wedge plate 912 and the fifth wedge plate 914 to expand away from, or contract toward, the third wedge plate 910, in contrast to the two-piece wedge clamp where the second wedge plate 908 moves away from or toward the first wedge plate 906.

Further Example Embodiments

The following examples pertain to further embodiments, from which numerous permutations and configurations will be apparent.

Example 1 provides a wedge clamp assembly comprising a first wedge plate including a first planar surface, and a first sawtooth surface opposite the first planar surface, the first wedge plate configured to be fixed with respect to an electronics module, the first sawtooth surface including two or more inclined faces with respect to the first planar surface; and a second wedge plate including a second planar surface and a second sawtooth surface opposite the second planar surface, the second wedge plate being adjustable with respect to the first wedge plate, the second sawtooth surface including two or more inclined faces with respect to the second planar surface.

Example 2 includes the subject matter of Example 1, wherein an angle of incline of the two or more inclined faces of the first sawtooth surface is equal to or substantially equal to an angle of incline of the two or more inclined faces of the second sawtooth surface.

Example 3 includes the subject matter of any one of Examples 1 and 2, wherein the two or more inclined faces of the first sawtooth surface are substantially in contact with the two or more inclined faces of the second sawtooth surface while the first sawtooth surface is engaged with the second sawtooth surface.

Example 4 includes the subject matter of any one of Examples 1-3, wherein a first angle of each of the two or more inclined faces of the first sawtooth surface with respect to the first planar surface is approximately the same as a second angle of each of the two or more inclined faces of the second sawtooth surface with respect to the second planar surface.

Example 5 includes the subject matter of Example 4, wherein the first angle and the second angle are each approximately four degrees with respect to the first planar surface and the second planar surface, respectively.

Example 6 includes the subject matter of any one of Examples 1-5, further comprising an adjustable fastener and an alignment pin, the adjustable fastener configured to apply a force against the second wedge plate to cause the second sawtooth surface to slide longitudinally along the first sawtooth surface, the alignment pin configured to interface with the second wedge plate to maintain contact between the first sawtooth surface and the second sawtooth surface as the second wedge plate slides with respect to the first wedge plate.

Example 7 includes the subject matter of Example 6, wherein a lateral expansion of the wedge clamp assembly applies a pressure in a wedge-like action between the first planar surface and an electronics module, and a pressure between the second planar surface and an electronics chassis.

Example 8 includes the subject matter of any one of Examples 6 and 7, wherein the adjustable fastener includes a threaded portion configured to engage with a corresponding threaded recess on the second wedge plate such that as the adjustable fastener is rotated, the force of such rotation against the threaded recess causes the second sawtooth surface to slide longitudinally along the first sawtooth surface.

Example 9 includes the subject matter of Example 8, wherein first wedge plate further includes, at a proximal end thereof, a first opening configured to receive the adjustable fastener, and a slot configured to receive the threaded recess of the second wedge plate therein, and wherein the first wedge plate further includes, at a distal end thereof, a second opening configured to receive the alignment pin.

Example 10 includes the subject matter of Example 9, wherein the second wedge plate includes, at a distal end thereof, a third opening configured to receive the alignment pin.

Example 11 includes the subject matter of any one of Examples 6-10, wherein the adjustable fastener includes a draw-type latch configured to engage with the second wedge plate such that as the adjustable fastener is drawn, the force of such drawing against the second wedge plate causes the second sawtooth surface to slide longitudinally along the first sawtooth surface.

Example 12 includes the subject matter of any one of Examples 1-11, wherein the first wedge plate and the second wedge plate each include a solid, thermally conductive material.

Example 13 includes the subject matter of any one of Examples 1-13, further comprising a mounting flange configured to be coupled to the first wedge plate and to an electronics module.

Example 14 includes the subject matter of any one of Examples 1-13, wherein the mounting flange is integral with the electronics module.

Example 15 provides an electronics module comprising a core including a printed circuit board; a first wedge plate fixed to the core, the first wedge plate including a first planar surface, and a first sawtooth surface opposite the first planar surface, the first wedge plate configured to be fixed with respect to an electronics module, the first sawtooth surface including two inclined faces with respect to the first planar surface; and a second wedge plate movable with respect to the first wedge plate, the second wedge plate including a second planar surface and a second sawtooth surface opposite the second planar surface, the second wedge plate being adjustable with respect to the first wedge plate, the second sawtooth surface including two inclined faces with respect to the second planar surface.

Example 16 includes the subject matter of Example 15, wherein an angle of incline of the two inclined faces of the first sawtooth surface is equal to or substantially equal to an angle of incline of the two inclined faces of the second sawtooth surface, and wherein the two inclined faces of the first sawtooth surface are substantially in contact with the two inclined faces of the second sawtooth surface while the first sawtooth surface is engaged with the second sawtooth surface.

Example 17 includes the subject matter of Example 16, wherein a lateral expansion of the first wedge plate with respect to the second wedge plate applies a pressure in a wedge-like action between the first planar surface and the core, and a pressure between the second planar surface and an electronics chassis.

Example 18 includes the subject matter of any one of Examples 15-17, further comprising an adjustable fastener and an alignment pin, the adjustable fastener configured to apply a force against the second wedge plate to cause the second sawtooth surface to slide longitudinally along the first sawtooth surface, the alignment pin configured to interface with the second wedge plate to maintain contact between the first sawtooth surface and the second sawtooth surface as the second wedge plate slides with respect to the first wedge plate.

Example 19 provides a kit comprising a first wedge plate including a first planar surface, and a first sawtooth surface opposite the first planar surface, the first sawtooth surface including two inclined faces with respect to the first planar surface; and a second wedge plate including a second planar surface and a second sawtooth surface opposite the second planar surface, the second sawtooth surface including two inclined faces with respect to the second planar surface.

Example 20 includes the subject matter of Example 19, further comprising a mounting flange configured to be coupled to the first wedge plate and to an electronics module.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be appreciated in light of this disclosure. The present disclosure should, therefore, be considered to encompass such combinations, variations, and modifications. It is intended that the scope of the present disclosure be limited not by this detailed description, but rather by the claims appended hereto. Future filed applications claiming priority to this application may claim the disclosed subject matter in a different manner and may generally include any set of one or more elements as variously disclosed or otherwise demonstrated herein.

What is claimed is:

1. A wedge clamp assembly comprising:
a first wedge plate including a first planar surface, and a first sawtooth surface opposite the first planar surface, the first wedge plate configured to be fixed with respect to an electronics module, the first sawtooth surface including two or more inclined faces with respect to the first planar surface;
a second wedge plate including a second planar surface and a second sawtooth surface opposite the second planar surface, the second wedge plate being adjustable with respect to the first wedge plate, the second sawtooth surface including two or more inclined faces with respect to the second planar surface; and
a mounting flange configured to be coupled to the first wedge plate and to the electronics module.

2. The wedge clamp assembly of claim 1, wherein an angle of incline of the two or more inclined faces of the first sawtooth surface is equal to or substantially equal to an angle of incline of the two or more inclined faces of the second sawtooth surface.

3. The wedge clamp assembly of claim 1, wherein the two or more inclined faces of the first sawtooth surface are substantially in contact with the two or more inclined faces of the second sawtooth surface while the first sawtooth surface is engaged with the second sawtooth surface.

4. The wedge clamp assembly of claim 1, wherein a first angle of each of the two or more inclined faces of the first sawtooth surface with respect to the first planar surface is approximately the same as a second angle of each of the two or more inclined faces of the second sawtooth surface with respect to the second planar surface.

5. The wedge clamp assembly of claim 4, wherein the first angle and the second angle are each approximately four degrees with respect to the first planar surface and the second planar surface, respectively.

6. The wedge clamp assembly of claim 1, further comprising an adjustable fastener and an alignment pin, the adjustable fastener configured to apply a force against the second wedge plate to cause the second sawtooth surface to slide longitudinally along the first sawtooth surface, the alignment pin configured to interface with the second wedge plate to maintain contact between the first sawtooth surface and the second sawtooth surface as the second wedge plate slides with respect to the first wedge plate.

7. The wedge clamp assembly of claim 6, wherein a lateral expansion of the wedge clamp assembly applies a pressure in a wedge-like action between the first planar surface and an electronics module, and a pressure between the second planar surface and an electronics chassis.

8. The wedge clamp assembly of claim 6, wherein the adjustable fastener includes a threaded portion configured to engage with a corresponding threaded recess on the second wedge plate such that as the adjustable fastener is rotated, the force of such rotation against the threaded recess causes the second sawtooth surface to slide longitudinally along the first sawtooth surface.

9. The wedge clamp assembly of claim 8, wherein first wedge plate further includes, at a proximal end thereof, a first opening configured to receive the adjustable fastener, and a slot configured to receive the threaded recess of the second wedge plate therein, and wherein the first wedge plate further includes, at a distal end thereof, a second opening configured to receive the alignment pin.

10. The wedge clamp assembly of claim 9, wherein the second wedge plate includes, at a distal end thereof, a third opening configured to receive the alignment pin.

11. The wedge clamp assembly of claim 6, wherein the adjustable fastener includes a draw-type latch configured to engage with the second wedge plate such that as the adjustable fastener is drawn, the force of such drawing against the second wedge plate causes the second sawtooth surface to slide longitudinally along the first sawtooth surface.

12. The wedge clamp assembly of claim 1, wherein the first wedge plate and the second wedge plate each include a solid, thermally conductive material.

13. The wedge clamp assembly of claim 1, wherein the mounting flange is integral with the electronics module.

14. An electronics module comprising:
a core including a printed circuit board;
a first wedge plate fixed to the core, the first wedge plate including a first planar surface, and a first sawtooth surface opposite the first planar surface, the first wedge plate configured to be fixed with respect to an electronics module, the first sawtooth surface including two inclined faces with respect to the first planar surface;
a second wedge plate movable with respect to the first wedge plate, the second wedge plate including a second planar surface and a second sawtooth surface opposite the second planar surface, the second wedge plate being adjustable with respect to the first wedge plate, the second sawtooth surface including two inclined faces with respect to the second planar surface; and
a mounting flange configured to be coupled to the first wedge plate and to the core.

15. The electronics module of claim 14, wherein an angle of incline of the two inclined faces of the first sawtooth surface is equal to or substantially equal to an angle of incline of the two inclined faces of the second sawtooth surface, and wherein the two inclined faces of the first sawtooth surface are substantially in contact with the two inclined faces of the second sawtooth surface while the first sawtooth surface is engaged with the second sawtooth surface.

16. The electronics module of claim 15, wherein a lateral expansion of the first wedge plate with respect to the second wedge plate applies a pressure in a wedge-like action between the first planar surface and the core, and a pressure between the second planar surface and an electronics chassis.

17. The electronics module of claim 14, further comprising an adjustable fastener and an alignment pin, the adjustable fastener configured to apply a force against the second wedge plate to cause the second sawtooth surface to slide longitudinally along the first sawtooth surface, the alignment pin configured to interface with the second wedge plate to maintain contact between the first sawtooth surface and the second sawtooth surface as the second wedge plate slides with respect to the first wedge plate.

18. A kit comprising:
a first wedge plate including a first planar surface, and a first sawtooth surface opposite the first planar surface, the first sawtooth surface including two inclined faces with respect to the first planar surface;
a second wedge plate including a second planar surface and a second sawtooth surface opposite the second planar surface, the second sawtooth surface including two inclined faces with respect to the second planar surface; and a mounting flange configured to be coupled to the first wedge plate and to an electronics module.

\* \* \* \* \*